United States Patent [19]

Hosokawa

[11] Patent Number: 5,192,991
[45] Date of Patent: Mar. 9, 1993

[54] CRYSTALLIZED POLYCRYSTALLINE SEMICONDUCTOR DEVICE

[75] Inventor: Makoto Hosokawa, Kanagawa, Japan

[73] Assignee: Semiconductor Energy Laboratory Co., Ltd., Kanagawa, Japan

[21] Appl. No.: 764,324

[22] Filed: Sep. 24, 1991

[30] Foreign Application Priority Data

Sep. 25, 1990 [JP] Japan ................................. 2-254515

[51] Int. Cl.$^5$ ............................................. H01L 27/14
[52] U.S. Cl. ....................................... 257/51; 136/258; 136/261; 257/53; 257/447; 257/460; 257/458; 257/461
[58] Field of Search .................. 357/30 J, 30 K, 30 P, 357/59 C, 59 D, 58, 2; 136/258, 261

[56] References Cited

U.S. PATENT DOCUMENTS

| 5,024,706 | 6/1991 | Kanai et al. | 357/30 J X |
| 5,034,333 | 7/1991 | Kim | 357/30 J X |
| 5,064,477 | 1/1991 | Delahoy | 357/30 J X |

Primary Examiner—William Mintel
Attorney, Agent, or Firm—Sixbey, Friedman, Leedom & Ferguson

[57] ABSTRACT

A polycrystalline semiconductor device and a method of manufacturing the device are disclosed. An amorphous semiconductor film is deposited on a glass substrate and given thermal treatment at a crystallization temperature of 600° C. or lower to form a polycrystalline photoconductive strucutre. The substrate is made from a material having the property of contracting at a percentage different than the semiconductor film by 10% or less, the contraction being caused by the thermal treatment.

12 Claims, 2 Drawing Sheets

“5,192,991”

CRYSTALLIZED POLYCRYSTALLINE SEMICONDUCTOR DEVICE

BACKGROUND OF THE INVENTION

1. Field of the Invention

The present invention relates in general to a semiconductor device and a method of manufacturing the same. More particularly, it relates to such a device composed of a polycrystalline semiconductor and a method of manufacturing the same.

2. Description of the Prior Art

Solar cells made of polycrystalline semiconductors have been manufactured by depositing a laminate composed of a lower conductive film, a photoconductive semiconductor film and an upper conductive film on glass substrates. The semiconductor film is deposited first in the form of an amorphous semiconductor film such as an a-Si film followed by thermal crystallization, for example at 600° C., in order to change the amorphous film to a polycrystalline film.

The thermal treatment for recrystallization has to be continued for several tens of hours. The amorphous semiconductor films often crack or come off from the substrates due to thermal contraction thereof. The cracks tend to form short current paths through the semiconductor film. In the case of a solar cell having a PIN junction for example, the p-type layer and the i-type layer are easily shorted through such cracks so that the electric characteristics are seriously deteriorated.

BRIEF SUMMARY OF THE INVENTION

It is an object of the present invention to provide a semiconductor device and a method of manufacturing the same.

It is another object of the present invention to provide a semiconductor device having a high reliability and a method of manufacturing the same.

It is a further object of the present invention to provide a semiconductor device which has no cracks in its semiconductor film and a method of manufacturing the same.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, a semiconductor device in accordance with an aspect of the present invention comprises:

a substrate; and a polycrystalline semiconductor film provided on said substrate, wherein said substrate is made from a material having the property of contracting at a percentage different than said semiconductor film by 10% or less, preferably at the substantially same percentage as said semiconductor film, said contraction being caused by thermal treatment for recrystallization of said semiconductor film.

The semiconductor film is first deposited on a substrate in the form of a non-single crystalline semiconductor, e.g. an amorphous semiconductor and then converted to a polycrystalline semiconductor film by the crystallization. In this process of recrystallization, typically, first the temperature is raised from a given temperature (i.e. the initial stage), e.g. room temperature, secondly the temperature is maintained at a recrystallization temperature (i.e. the intermediate stage), and finally the temperature is lowered to a given temperature (i.e. the last stage), e.g. room temperature. A glass substrate and a semiconductor film provided thereon in accordance with the present invention contracts (that is, the glass substrate at the last stage is smaller than that at the initial stage and also the semiconductor film at the last stage is smaller than that at the initial stage.) The difference between a percentage of such contraction of the substrate and that of the semiconductor film is 10% or less, preferably substantially 0%. In the case of a silicon semiconductor, the crystallization temperature is preferably 600° C. or less. The substrate is for example made of AN-2 non-alkali glass manufactured by Asahi Glass Corp. The semiconductor film may be made of a photoconductive semiconductor.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1:
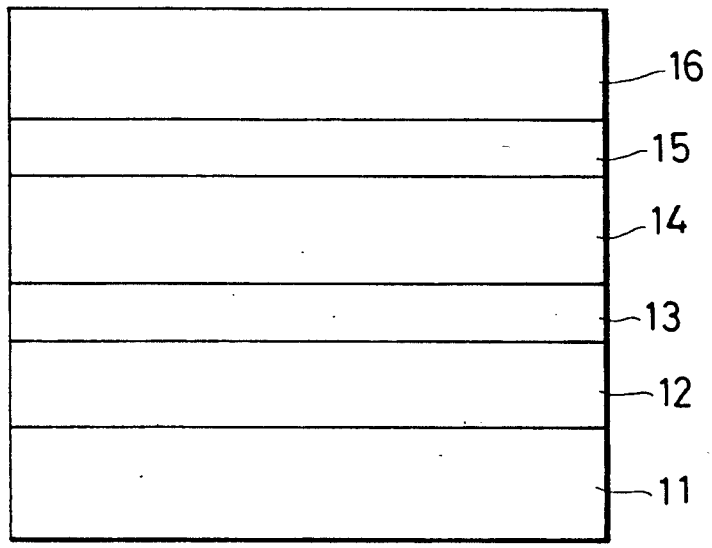
FIG. 1 is a cross sectional view showing a polycrystalline silicon semiconductor solar cell manufactured in accordance with the present invention.
Figure 2:
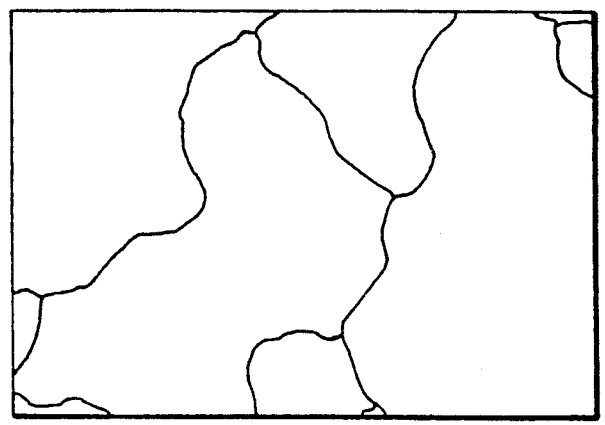
FIG. 2 is a schematic diagram showing cracks occurring in a prior art solar cell.
Figure 3:
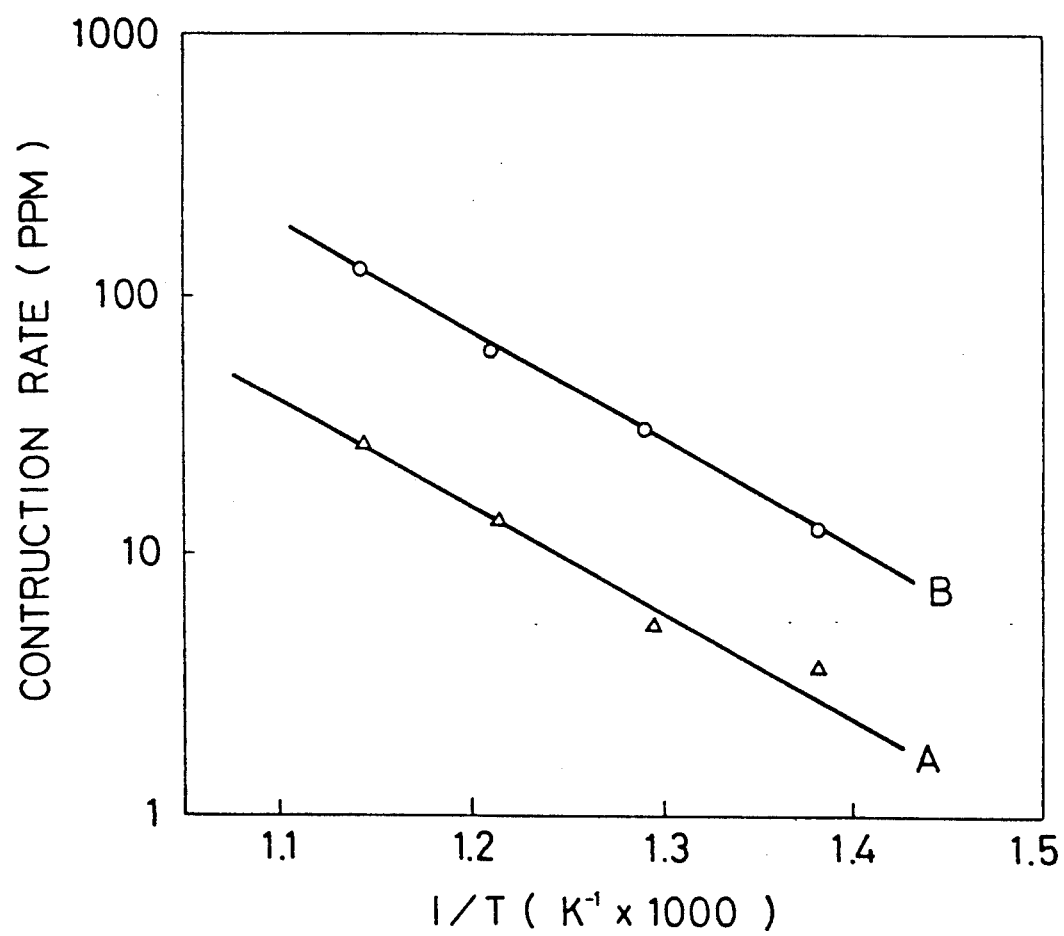
FIG. 3 is a graphical diagram showing the contraction rates of silicon semiconductor films.

Referring now to FIGS. 1, 2 and 3 and initially to FIG. 1, a solar cell and a method of manufacturing the same in accordance with a preferred embodiment of the present invention will be explained.

A substrate 11 is made of an AN-2 non-alkali glass plate and coated with a lower electrode film 12 by sputtering or evaporation to a thickness of 500 to 2000 Å. The electrode film is made of a metal such as chromium. An N-type amorphous silicon semiconductor film 13 is deposited to a thickness of 100 to 500 Å by plasma CVD on the electrode film 12. The reactive gas is a mixture of phosphine and monosilane ($PH_3/SiH_4$=0.1 to 1.0) introduced at a total flow ratio of 500SCCM. The input RF power is 10 to 80 W (13.56MHz). The pressure of the reactive gas is 0.01 to 1 Torr. The substrate temperature is 100° to 400° C. An intrinsic amorphous silicon semiconductor film 14 is deposited in the same manner to a thickness of 0.5 to 5 micrometers by plasma CVD on the N-type semiconductor film 13. The reactive gas is monosilane introduced at a flow ratio of 10 to 100SCCM. The input RF power is 10 to 80 W (13.56 MHz). The pressure of the reactive gas is 0.01 to 1 Torr. The substrate temperature is 100° to 400° C. A P-type amorphous silicon semiconductor film 15 is deposited to a thickness of 100 to 500 Å by plasma CVD on the intrinsic semiconductor film 14. The reactive gas is a mixture of diborane and monosilane ($B_2H_6/SiH_4$=0.1 to 1.0) introduced at a total flow ratio of 50SCCM. The input RF power is 10 to 80 W (13.56 MHz). The pressure of the reactive gas is 0.01 to 1 Torr. The substrate temperature is 100° to 400° C.

The laminate semiconductor 13, 14 and 15 is thermally recrystallized at a recrystallization temperature of 600° C. for 10 to 100 hours in an $N_2$ atmosphere to make it polycrystalline, followed by coating of a transparent conductive film having a thickness of 2000 Å such as an ITO film on the semiconductor film 15 as an upper electrode film 16 by a known sputtering. The polycrystalline silicon solar cell is thus completed. In accordance with experiments, there was confirmed no cracks even through a microscope in the laminate semiconductors manufactured by the above procedure utilizing the AN-2 non-alkali glass substrate. When utilizing a usual quartz substrate in place of the AN-2 non-alkali glass substrate for reference, many cracks were observed as illustrated in FIG. 2.

In accordance with a measurement in which firstly thickness of a silicon semiconductor film is measured at room temperature (i.e. the initial stage) and secondly the semiconductor film is heated at 600° C. and thirdly the temperature of the semiconductor film is lowered to room temperature and finally thickness of the semiconductor film is measured at room temperature (i.e. the last stage), the thickness of the semiconductor film at the last stage is smaller than that at the initial stage by 3%. In accordance with another measurement carried out for an AN-2 non-alkali glass in the same manner as the above measurement, the thickness of the glass at the last stage is smaller than that at the initial stage by 0.03%.

The thermal contraction rate of the AN-2 non-alkali glass can be controlled by giving thermal treatment in advance of the above procedure. FIG. 3 shows the temperature dependence of the AN-2 non-alkali glass distributed by Asahi Glass Corp. Curve A was plotted in the case that thermal treatment was given to the glass substrate at 610° C. for 12 hours. Curve B was plotted in the case that thermal treatment was not given. The characteristics of the solar cell as formed by the above procedure were furthermore improved by appropriate thermal treatment given in advance.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, the present invention can be applied to the cases where the semiconductor film is first deposited on the substrate in the form of microcrystalline semiconductors or other non-single crystalline semiconductors which have not perfectly been crystallized. Also, the present invention can be applied to the cases where other glasses, e.g. Corning 7059 glass manufactured by Corning Incorporated, are used in place of the AN-2 non-alkali glass. In accordance with a measurement carried out for the Corning 7059 glass in the same manner as the measurement of the foregoing preferred embodiment, thickness of the Corning 7059 glass at the last stage is smaller than that at the initial stage by 0.3%.

What is claimed is:

1. A semiconductor device comprising:
   a substrate; and
   a polycrystalline semiconductor film provided on said substrate,
   wherein said substrate is made from a material having the property of contracting at substantially the same percentage as said semiconductor film, said contraction being caused by thermal treatment for crystallization of said semiconductor film.

2. The semiconductor device as claimed in claim 1 wherein said substrate is a glass substrate.

3. The semiconductor device as claimed in claim 2 wherein said semiconductor film is made of a photoconductive semiconductor.

4. The semiconductor device as claimed in claim 3 wherein said device is a photoelectric conversion device.

5. The semiconductor device as claimed in claim 2 wherein said semiconductor film is made of a silicon semiconductor.

6. The semiconductor device as claimed in claim 5 wherein said crystallization is carried out at 600° C. or lower.

7. The semiconductor device as claimed in claim 6 wherein the silicon semiconductor film is composed of a pin junction.

8. The semiconductor device as claimed in claim 7 further comprising a lower electrode located between said substrate and said semiconductor film and an upper electrode formed over said semiconductor film.

9. The semiconductor device as claimed in claim 8 wherein said device is constructed as a solar cell.

10. A semiconductor device comprising:
    a substrate; and
    a polycrystalline semiconductor film provided on said substrate,
    wherein said substrate is made from a material having the property of contracting at a percentage different from said semiconductor film by 10% or less, said contraction being caused by thermal treatment for crystallization of said semiconductor film.

11. The semiconductor device as claimed in claim 10 wherein said substrate is a glass substrate.

12. The semiconductor device as claimed in claim 10 wherein said device is a photoelectric conversion device.

* * * * *